(12) United States Patent
Nguyen et al.

(10) Patent No.: US 10,076,055 B2
(45) Date of Patent: Sep. 11, 2018

(54) SYSTEMS AND METHODS FOR COOLING A COMPARTMENTALIZED AND DUCTED ELECTRICAL ENCLOSURE

(71) Applicant: General Electric Company, Schenctady, NY (US)

(72) Inventors: Quoc Hoai Nguyen, Houston, TX (US); Nam Tran, Houston, TX (US); Justin Benden, Houston, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/174,670

(22) Filed: Jun. 6, 2016

(65) Prior Publication Data

US 2017/0354059 A1 Dec. 7, 2017

(51) Int. Cl.
*H05K 7/20* (2006.01)
*F01D 25/12* (2006.01)

(52) U.S. Cl.
CPC ......... *H05K 7/20145* (2013.01); *F01D 25/12* (2013.01); *H05K 7/20572* (2013.01); *H05K 7/20909* (2013.01); *F05D 2220/32* (2013.01)

(58) Field of Classification Search
CPC ............................ H05K 7/20145; F01D 25/12
USPC .................. 361/692; 318/471; 454/254, 237
See application file for complete search history.

(56) References Cited

U.S. PATENT DOCUMENTS

| | | | |
|---|---|---|---|
| 2,720,149 A | 10/1955 | Groene | |
| 2,945,733 A | 7/1960 | Malia | |
| 4,535,386 A | 8/1985 | Frey, Jr. et al. | |
| 6,101,825 A * | 8/2000 | Park | F24F 13/12 62/186 |
| 6,671,160 B2 * | 12/2003 | Hayden | H05F 3/02 361/212 |
| 2008/0002347 A1 * | 1/2008 | Basham | H01R 35/025 361/679.33 |
| 2009/0310300 A1 | 12/2009 | Chrysler | |
| 2010/0317278 A1 * | 12/2010 | Novick | F24F 11/0001 454/184 |
| 2011/0235272 A1 * | 9/2011 | Bash | H05K 7/20609 361/692 |
| 2015/0016971 A1 | 1/2015 | Freeman et al. | |

(Continued)

FOREIGN PATENT DOCUMENTS

| | | |
|---|---|---|
| CA | 2858106 | 7/2014 |
| DE | 2458497 | 6/1976 |

(Continued)

*Primary Examiner* — Mandeep S Buttar
(74) *Attorney, Agent, or Firm* — Fletcher Yoder, P.C.

(57) ABSTRACT

In one embodiment, the system includes one or more electrical components associated with turbomachinery, and the one or more electrical components are disposed within two or more interior compartments of an electrical enclosure. The system also includes a cooling system coupled to the electrical enclosure. The cooling system includes one or more air ducts configured to direct a cooling air to each interior compartment of the two or more interior compartments. The cooling system also includes a controller configured to route cooling air to each interior compartment via the one or more air ducts. The controller is configured to independently regulate a thermal environment for each interior compartment of the two or more interior compartments.

19 Claims, 5 Drawing Sheets

(56) References Cited

U.S. PATENT DOCUMENTS

2015/0214879 A1\* 7/2015 Huntington ............. F01D 17/02
290/40 B

FOREIGN PATENT DOCUMENTS

EP 2612995 7/2013
EP 2715255 4/2014

\* cited by examiner

SYSTEMS AND METHODS FOR COOLING A COMPARTMENTALIZED AND DUCTED ELECTRICAL ENCLOSURE

BACKGROUND OF THE INVENTION

The subject matter disclosed herein generally relates to gas turbine engines and associated cooling systems, and more specifically relates to cooling a compartmentalized and ducted electrical enclosure.

Gas turbine engines include one or more turbine stages driven by hot gases of combustion. For example, a gas turbine engine includes a compressor section, a combustor section, and a turbine section. The compressor section includes one or more compressor stages configured to compress an oxidant (e.g., air), which is then routed to the combustor section. The combustor section includes one or more combustors configured to combust a fuel with the oxidant (e.g., air) to generate the hot gases of combustion. The turbine section includes one or more turbine stages driven by the hot gases of combustion, where the hot gases of combustion pass through the turbine stages and eventually to the environment as exhaust. The gas turbine engine generates a considerable amount of heat, and various cooling systems may be utilized to cool components associated with the gas turbine system. Further, components associated with the gas turbine system may also be subject to heat generated by ambient conditions (e.g., external air, temperature, sunlight, humidity, etc.)

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, the system includes one or more electrical components associated with turbomachinery, and the one or more electrical components are disposed within two or more interior compartments of an electrical enclosure. The system also includes a cooling system coupled to the electrical enclosure. The cooling system includes one or more air ducts configured to direct a cooling air to each interior compartment of the two or more interior compartments. The cooling system also includes a controller configured to route cooling air to each interior compartment via the one or more air ducts. The controller is configured to independently regulate a thermal environment for each interior compartment of the two or more interior compartments.

In a second embodiment, a system includes an electrical enclosure configured to house one or more electrical components within two or more interior compartments, and the one or more electrical components are associated with turbomachinery. The system also includes a cooling system coupled to the electrical enclosure, and the cooling system includes one or more air ducts configured to direct a cooling air to each interior compartment of the two or more interior compartments. The cooling system also includes a vent system associated with each interior compartment of the two or more interior compartments. The vent system is configured to block a flow of the cooling air into each interior compartment when the interior compartment is accessed.

In a third embodiment, a system including a gas turbine system is provided. The system includes an electrical enclosure configured to house a plurality of electrical components, and the plurality of electrical components are associated with at least one component of the gas turbine system. The electrical enclosure includes two or more cooling compartments, and each of the two or more cooling compartments are configured to house a portion of the plurality of electrical components. The electrical enclosure includes a cooling system configured to regulate one or more vents associated with each of the two or cooling compartments. The cooling system is configured to independently regulate a thermal environment for each of the two or more cooling compartments.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The disclosed embodiments are directed towards systems and methods for a cooling system configured to cool electrical components disposed within a compartmentalized electrical enclosure. In particular, the electrical components disposed within the electrical enclosure may be communicatively coupled to one or more components of a gas turbine system, and may be configured to monitor and/or control one or more operational functions of the gas turbine system. Further, the electrical enclosure may be divided into one or more compartments, such that each compartment of the electrical enclosure may be separately accessible from the other compartments. For example, the electrical enclosure may include an external access door to provide access to the electrical enclosure, as well as one or more internal access doors that each provides individual access to a compartment of the electrical enclosure. In certain embodiments, the electrical enclosure may be a Main Turbine Terminal Box (e.g., MTTB) that is located proximate to the gas turbine system. However, it should be noted that the disclosed systems and methods may be utilized to cool electrical components disposed within any compartmentalized electrical enclosure.

In particular, the disclosed embodiments are directed towards systems and methods for a cooling system configured to independently regulate a thermal environment for each of the one or more compartments of the electrical enclosure. For example, the cooling system may include a series of air distribution systems, such that each compartment is associated with an air distribution system. In certain embodiments, the air distribution system may include a series of ducts to provide cooling air and/or to remove waste heat from the compartment. In certain embodiments, the cooling system may include a controller configured to receive thermal feedback from each of the one or more compartments of the electrical enclosures, and may regulate the cooling of each compartment based on the thermal feedback. For example, one or more sensors disposed within each individual compartment may be communicatively coupled to the controller, and may be configured to provide thermal feedback utilized by the controller to regulate the thermal environment of the compartment. Further, in certain embodiments, the air distribution system may include a mechanical trigger and/or switch that may be utilized to determine when the compartment is accessed. Accordingly, in such embodiments, the cooling system may be configured to temporarily shut off, via one or more vents, cooling air provided to the accessed compartment.

In this manner, the cooling system may be configured to independently monitor and/or regulate a desired thermal environment for each compartment of the one or more compartments of the electrical enclosure. Specifically, the thermal environment of each compartment of the electrical enclosure may be separately regulated, thereby enabling access to an individual compartment while the remaining compartments continue to be cooled to a desired temperature and/or temperature range. In this manner, when particular electrical components are accessed, such as for repair or maintenance, the remaining electrical components continue to be cooled. Accordingly, the electrical enclosure may retain cooling air to enhance the efficiency of the system.

In certain embodiments, the electrical enclosure may be divided into one or more compartments, so that, for example, each compartment may be separately accessible for maintenance and/or repair. In certain embodiments, the electrical components may be grouped within the compartments based on functionality, type, size, or a combination thereof. In some situations, the electrical components may be grouped into a compartment based on the type of thermal environment suitable for optimal function and performance. In some situations, the electrical components may be grouped according to a frequency with which the electrical components are accessed, such as for maintenance and/or repair. Indeed, the disclosed embodiments may provide a cooling system configured to regulate the thermal environment of the electrical components based on a predetermined thermal range, thermal feedback from a particular compartment, and/or the mechanical trigger or the switch utilized to indicate whether the compartment is open or closed. In this manner, the disclosed embodiments are directed to regulating and monitoring the thermal environment of each of the one or more compartments in a targeted and efficient manner, as further described in detail below.

Figure 1:
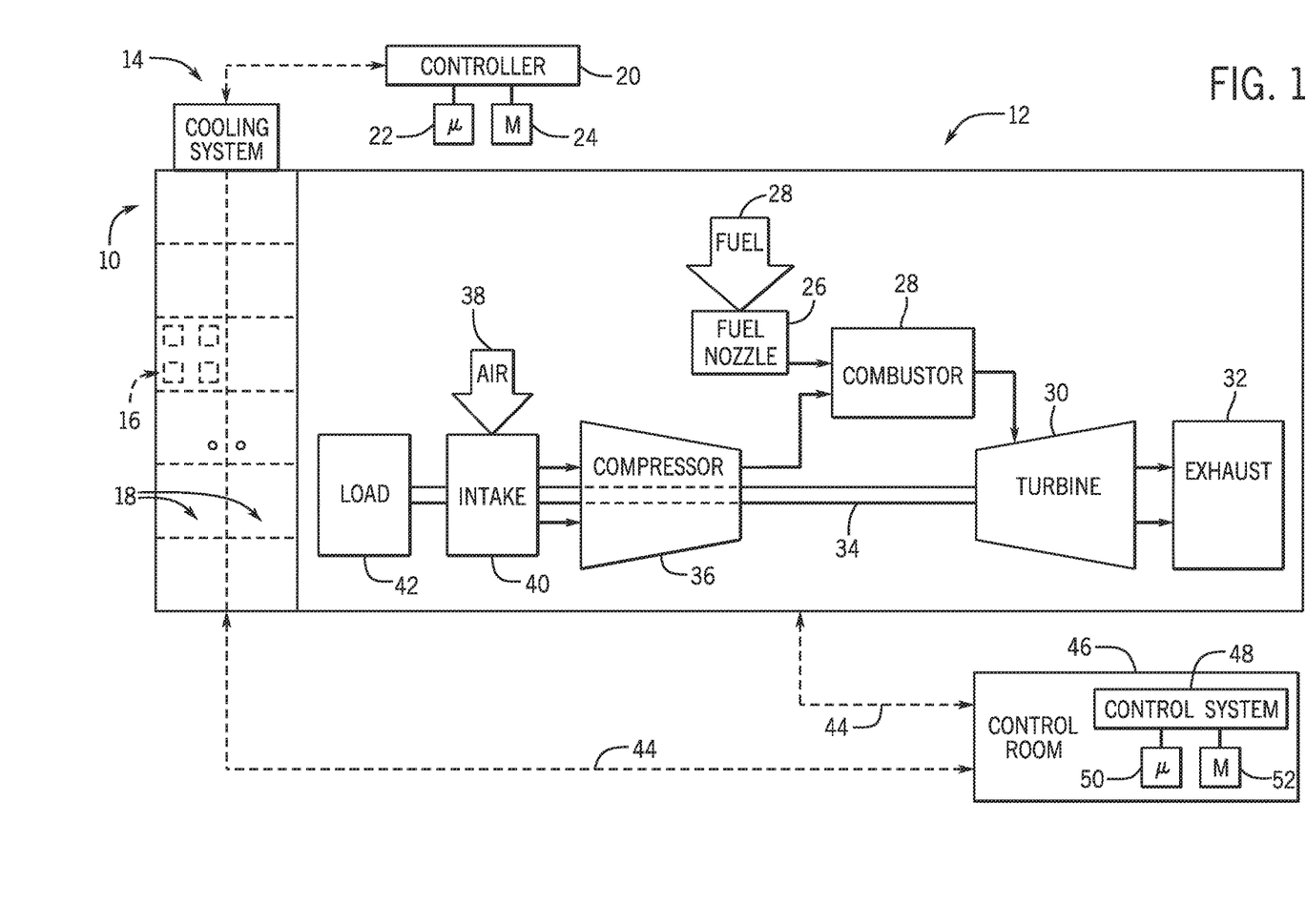
FIG. 1 is a schematic block diagram illustrating an electrical enclosure associated with a gas turbine system, where the electrical enclosure is coupled to a cooling system.

FIG. 1 is a schematic block diagram illustrating an electrical enclosure 10 associated with a gas turbine system 12, where the electrical enclosure 10 is coupled to a cooling system 14. In the illustrated embodiment, the electrical enclosure 10 is disposed adjacent to the gas turbine system 12. In other embodiments, the electrical enclosure 10 may be proximate, but not adjacent, to the gas turbine system 12. In particular, one or more electrical components 16 disposed within the electrical enclosure 10 are communicatively coupled to one or more components of the gas turbine system 12. The electrical components 16 may be organized or categorized into one or more compartments 18 of the electrical enclosure 10, as further described with respect to FIGS. 2 and 3. In particular, the cooling system 14 coupled to the electrical enclosure 10 may be configured to individually monitor and/or regulate the thermal environment of each of the one or more compartments 18 of the electrical enclosure 10 from waste heat emitted by the gas turbine system 12. For example, the cooling system 10 may include a controller 20 (coupled to a processor 22 and a memory 24) configured to receive feedback (e.g., thermal feedback) from each component 18 of the electrical enclosure 10. Further, the controller 20 may be configured to utilize the received feedback to separately control a thermal environment for each component 18 of the electrical enclosure 10, as further described with respect to FIGS. 2 and 3.

The gas turbine system 12 may use liquid or gas fuel, such as natural gas and/or a hydrogen rich synthetic gas, to drive the gas turbine system 12. As depicted, the fuel nozzle 26 intakes a fuel supply 28, mix the fuel with air, and distribute the fuel-air mixture into a combustor 28 in a suitable ratio for combustion, emissions, fuel consumption, and power output. In certain embodiments, the gas turbine system 12 may include one or more fuel nozzles 26 and one or more combustors 28. Further, the fuel nozzles 26 may be located inside one or more combustors 28. The fuel-air mixture combusts in a chamber within the combustor 28, thereby creating hot pressurized exhaust gases. The combustor 28 directs the exhaust gases through a turbine 30 toward an exhaust outlet 32. As the exhaust gases pass through the turbine 30, the gases force turbine blades to rotate a shaft 34 along an axis of the gas turbine system 12. As illustrated, the shaft 34 may be connected to various components of the gas turbine system 12, including a compressor 36. The compressor 36 also includes blades coupled to the shaft 34. As the shaft 34 rotates, the blades within the compressor 36 also rotate, thereby compressing air 38 from an air intake 40 through the compressor 36 and into the fuel nozzle 26 and/or the combustor 28. In certain embodiments, the shaft 34 may also be connected to a load 42 (e.g., coupled to either side of the gas turbine system 12), which may be a vehicle or a stationary load, such as an electrical generator in a power plant or a propeller on an aircraft, for example. The load 42 may include any suitable device capable of being powered by the rotational output of the gas turbine system 12. In certain embodiments, the gas turbine system 12 may not be coupled to a load 42.

In certain embodiments, various operations and/or functions of the gas turbine system 12 may generate heat that is dissipated into the surrounding environment. In certain embodiments, the electrical enclosure 10 may be proximate to the gas turbine system 12, such that waste heat produced during operation of the gas turbine system 12 dissipates to the electrical enclosure 10. For example, in some situations, the electrical enclosure 10 may be disposed adjacent to the gas turbine system 12 and/or disposed in a location proximate, but not adjacent, to the gas turbine system 12. Indeed, the electrical components 16 disposed within the electrical enclosure 10 may be communicatively coupled to one or more components of the gas turbine system 12. Further, in certain embodiments, the electrical components 16 disposed within the electrical enclosure 10 may be utilized to regulate the function and/or operation of the gas turbine system 12. In certain embodiments, the electrical enclosure 10 may be external to the gas turbine system 12, but may be located on the same skid as the gas turbine system 12. The electrical components 16 disposed within the electrical enclosure 10 may include one or more different types of inputs/outputs, switches (e.g., Ethernet switches, relay switches, temperature switches, pressure switches, microswitches, etc.), control and monitoring circuits, electrical cables, wiring and connectors, alarms, indicating and/or warning systems, auxiliary components, digital data equipment, or other types of gas turbine engine control/monitoring equipment.

In certain embodiments, the electrical components 16 disposed within the electrical enclosure 10 may be communicatively coupled, via wired or wireless networks 44 (e.g., via Ethernet and/or Internet protocols), to a control room 46. The control room 46 may be configured to further monitor and/or regulate the operations of the gas turbine system 12. For example, the control room 46 may be remote from the gas turbine system 12, and may include a control system 48 (coupled to processing circuitry 50 and/or a memory device 52) that is configured to regulate operations of the gas turbine system 12. In certain embodiments, the electrical components 16 may include various input/output devices coupled to the gas turbine system 12, and may be configured to gather and communicate information related to the gas turbine system 12 to the control system 48.

In particular, it may be beneficial to manage the thermal environment of the electrical components 16 disposed within the electrical enclosure 10, in order to improve the reliability and life of these components. For example, electrical components 16 may work optimally when the thermal environment surrounding the electrical components 16 is within a particular temperature range. Accordingly, it may be beneficial to regulate the temperature changes resulting from waste heat and/or excess heat that dissipates into the environment surrounding the electrical components 16. As noted above, without the disclosed embodiments, in some situations, heat generated by typical operations of the gas turbine system 10 may cause variations within the thermal environment (e.g., increase in temperature) surrounding the electrical components. Further, without the disclosed embodiments, in some situations, excess heat generated from typical operations of the electrical components 16 within the electrical enclosure 10 may also cause variations within the thermal environment (e.g., increase in temperature) surrounding the electrical components 16. Additionally, without the disclosed embodiments, in some situations, accessing the electrical components 16 for maintenance and/or repair may cause sudden variations in the thermal environment surrounding the electrical components 16. For example, the electrical components 16 may be exposed to the external environment when the electrical enclosure 10 (and/or a compartment 18 of the electrical enclosure 10) is opened and accessed for maintenance and/or repair. In these and other situations, the thermal environment of an individual compartment 18 and/or the thermal environment of the electrical enclosure 10 may vary outside of a desired thermal range.

Accordingly, in certain embodiments, the cooling system 14 may be utilized to regulate and/or monitor the thermal environment for the electrical enclosure 10. In particular, the cooling system 14 may be configured to independently regulate the thermal environment for each compartment 18 of the one or more compartments 18 of the electrical enclosure 10, as further described with respect to FIGS. 2 and 3. Specifically, the controller 20 of the cooling system 14 may receive feedback from each of the one or more compartments 18, and may utilize the received feedback to regulate the cooling of each compartment 18 independently of the other compartments 18. In this manner, the electrical components 16 disposed within different compartments 18 of the electrical enclosure 10 may be regulated independently of other electrical components 16. Further, the cooling system 14 may be configured to regulate the thermal environment of a particular compartment 18, such that when the compartment 18 is accessed for maintenance and/or repair, thermal variations in the accessed compartment 18 do not affect the electrical enclosure 10 as a whole.

Figure 2:
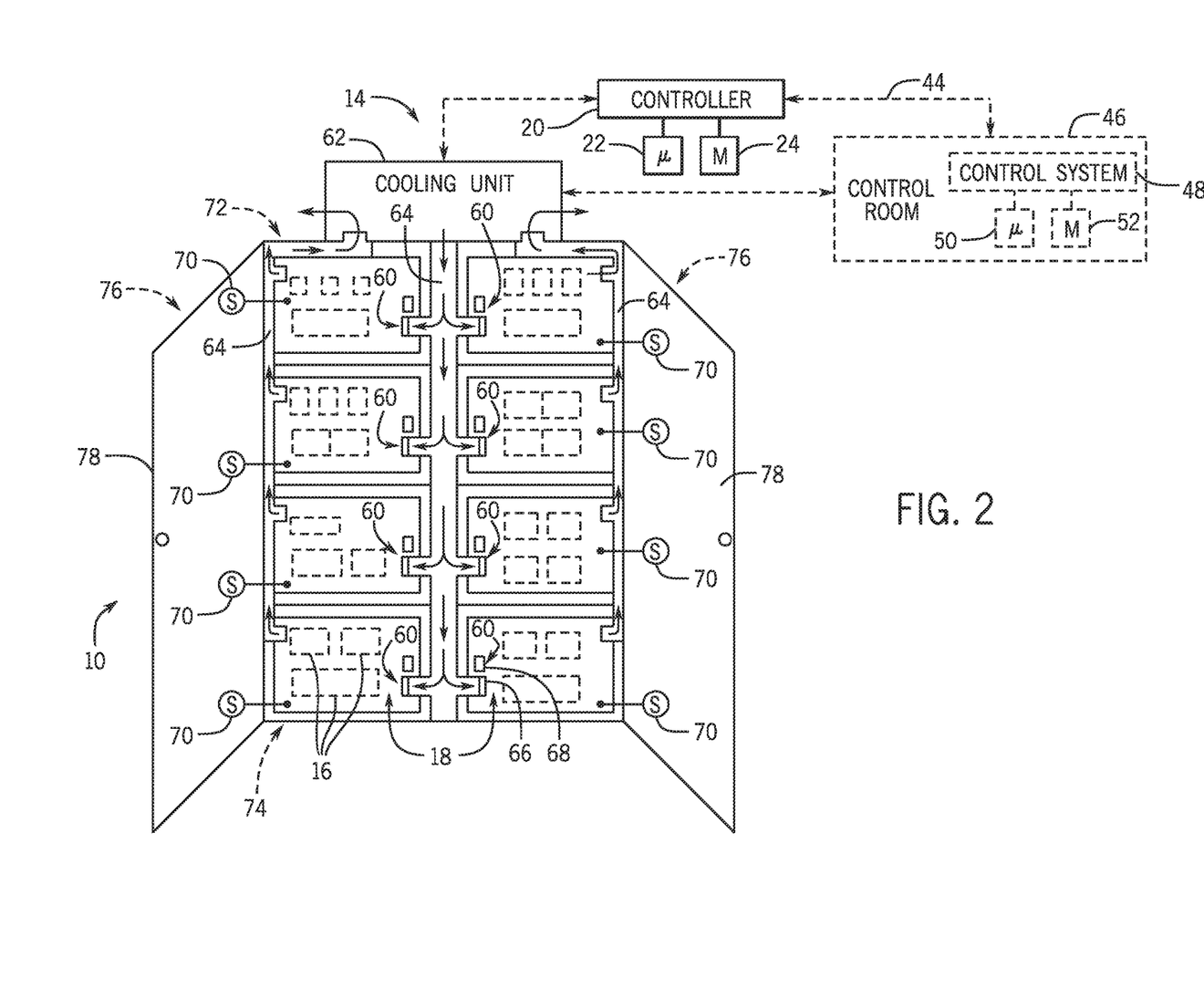
FIG. 2 is a schematic block diagram illustrating the electrical enclosure of FIG. 1 having one or more individual compartments, where each compartment is individually coupled to the cooling system of FIG. 1.

FIG. 2 is a schematic block diagram illustrating the electrical enclosure 10 of FIG. 1 having the one or more individual compartments 18, where each compartment 18 is independently coupled to the cooling system 14 of FIG. 1. In particular, the cooling system 14 may include the controller 20, a series of air distribution systems 60, and a cooling unit 62. In certain embodiments, the controller 20 may be disposed within the cooling unit 62, or may be separate from the cooling unit 62. In certain embodiments, each compartment 18 may be associated with an air distribution system 60 of the cooling system 14. In certain embodiments, the cooling unit 62 may be configured to provide cooling air to and/or remove waste heat from each compartment 18 via the air distribution system 60 associated with the compartment 18, as further described in detail below. In certain embodiments, each air distribution system 60 associated with each compartment 18 may include a series of air ducts 64, a vent system 66, a trigger system 68, and/or one or more sensors 70, as further described with respect to FIG. 3. In addition, in certain embodiments, the controller 18 may be configured to monitor and/or regulate the cooling air provided to and/or the waste heat removed from each of the one or more compartments 18, as further described with respect to FIG. 3.

In certain embodiments, the electrical enclosure 10 may be utilized to support electrical circuitry and the electrical components 16 disposed therein. Indeed, the electrical enclosure 10 may be configured to receive and/or send signals from the gas turbine system 12 and/or the control room 46. For example, the electrical enclosure 10 may support the electrical components 16 communicatively coupled to the components of the gas turbine system 12, and may be configured to receive and/or send data/control signals. As noted above, the electrical components 16 may include one or more different types of inputs/outputs, switches (e.g., Ethernet switches, relay switches, temperature switches, pressure switches, microswitches, etc.), control and monitoring circuits, electrical cables, wiring and connectors, alarms, indicating and/or warning systems, auxiliary components, digital data equipment, or other types of gas turbine engine control/monitoring equipment. Indeed, the electrical components 16 may include any components for controlling a system or a process, such as the gas turbine system 12 and/or operations of the gas turbine system 12. Further, the electrical components 16 may include any accessory components associated with controlling a system or a process, such as accessory components (e.g., displays) associated with the gas turbine system 12.

In particular, the electrical enclosure 10 may be divided into individual compartments 18 that support the electrical components 16. In certain embodiments, the electrical components 16 may be housed within particular compartments 18 and may be interconnected with electrical components 16 disposed within other compartments 18. Further, in certain embodiments, the electrical components may be grouped into a compartment based on the type of thermal environment suitable for optimal function and performance. For example, the electrical components 16 may be categorized according to an optimal thermal range, such that the electrical components 16 that optimally function in higher and/or lower temperatures are grouped together within a particular compartment 18. As a further example, one or more electrical components 16 may be categorized based on a component of the gas turbine system 12 (e.g., the turbine 30, the compressor 36, the combustor 28, the fuel nozzles 26, the shaft 34, etc.) the electrical components 16 are intended to control and/or monitor. For example, electrical components 16 associated with the turbine 30 may be grouped within a particular compartment 18. As a further example, one or more of the electrical components 16 may be categorized within the compartment 18 based on component type (e.g., switches, circuits, cables, connectors, etc.).

In certain embodiments, because the electrical components 16 within the electrical enclosure 10 function in an electrical environment, doors may be used to control and regulate access to the interior of the electrical enclosure 10 and/or the compartments 18. For example, the electrical enclosure 10 may include one or more external surfaces (e.g., a top surface 72, a bottom surface 74, and one or more side surfaces 76) that form a cabinet type enclosure. The electrical enclosure 10 may include a set of external doors 78 (and/or a single external door 78) that may be utilized to access the interior of the electrical enclosure 10. In certain embodiments, the external doors 78 may be attached to the electrical enclosure 10 with hinges, latches, guide rails, threaded fasteners, hook and slot coupling, or any combination thereof. Further, the electrical enclosure 10 may be divided into the compartments 18, and each compartment 18 may be covered by an internal door 79 (and/or one or more internal doors 79), as further described with respect to FIGS. 4-6. In certain embodiments, the internal doors 79 may be attached to the compartment 18 and/or the electrical enclosure 10 with hinges, latches, guide rails, or any combination thereof. In certain embodiments, the internal doors 79 may be fixed, and may be utilized to withdraw the compartment 18 from the enclosure 10. The external doors 78 and the internal doors 78 may be accessed during normal operations (e.g., electrical enclosure 10 operations and/or gas turbine system 12 operations) for maintenance and/or repair.

In the illustrated embodiment, the cooling system 14 is disposed on the top surface 72 of the electrical enclosure 10. However, it should be noted that the cooling system 14 may be disposed at any location proximate to the electrical enclosure 10, such that the components of the cooling system 14 (e.g., ducts) are accessible to each compartment 18 of the electrical enclosure 10. For example, the cooling system 14 may be disposed adjacent to the electrical enclosure 10 and/or may be disposed at a location apart from the electrical enclosure 10. As a further example, the cooling system 14 may be disposed external to the gas turbine system 12, but may be disposed on the same skid. In these and other embodiments, the cooling system 14 may include the series of air ducts 64 that route a coolant to and/or from each compartment 18 of the electrical enclosure 10. In certain embodiments, the cooling system 14 may utilize a gaseous coolant, such as air, hydrogen, inert gases, or any other type of gaseous coolant. In some embodiments, the cooling system 14 may access the coolant from a source within the gas turbine system 12, while in other embodiments, the coolant may be received from an external source.

In certain situations, without the disclosed embodiments, localized heating of one or more regions of the electrical enclosure 10, such as due to excess heat produced within the electrical enclosure 10 and/or due to waste heat received from the gas turbine system 12, may potentially cause damage to wires, insulation, electrical components, and/or the structure of the electrical enclosure 10. Further, in certain embodiments, localized heating of the one or more regions of the electrical enclosure 10 may occur from ambient external conditions, such as the external air, external temperature, sunlight, humidity, etc. Accordingly, in certain embodiments, it may be beneficial to provide cooling air to the electrical enclosure 10, and more particularly, to each of the one or more compartments 18 of the electrical enclosure 10. In particular, the cooling unit 62 may be configured to provide cooling air to each compartment 18 via the air distribution system 60 associated with the compartment 18. Furthermore, the cooling unit 62 may be configured to remove heat from each compartment 18 via the air distribution system 60 associated with the compartment 18. For example, in certain embodiments, each air distribution system 60 associated with each compartment 18 may include the series of air ducts 64, the vent system 66, the trigger system 68, and/or the one or more sensors 70, as further described with respect to FIG. 3.

In certain embodiments, the cooling unit 62 may utilize a closed loop circuit and/or an open loop circuit for cooling the electrical enclosure 10. For example, the cooling system 14 may be an open circuit configured to route the coolant (e.g., cooling air) into the compartments 18 and then directly into the atmosphere. In certain embodiments, the cooling system 14 may be an open circuit configured to route the coolant (e.g., cooling air) into the compartments 18, and then back to the cooling system 14. Accordingly, the cooling system 14 may be configured to monitor and/regulate the thermal environment of each compartment 18, via the associated air distribution system 60, as further described with respect to FIG. 3.

Figure 3:
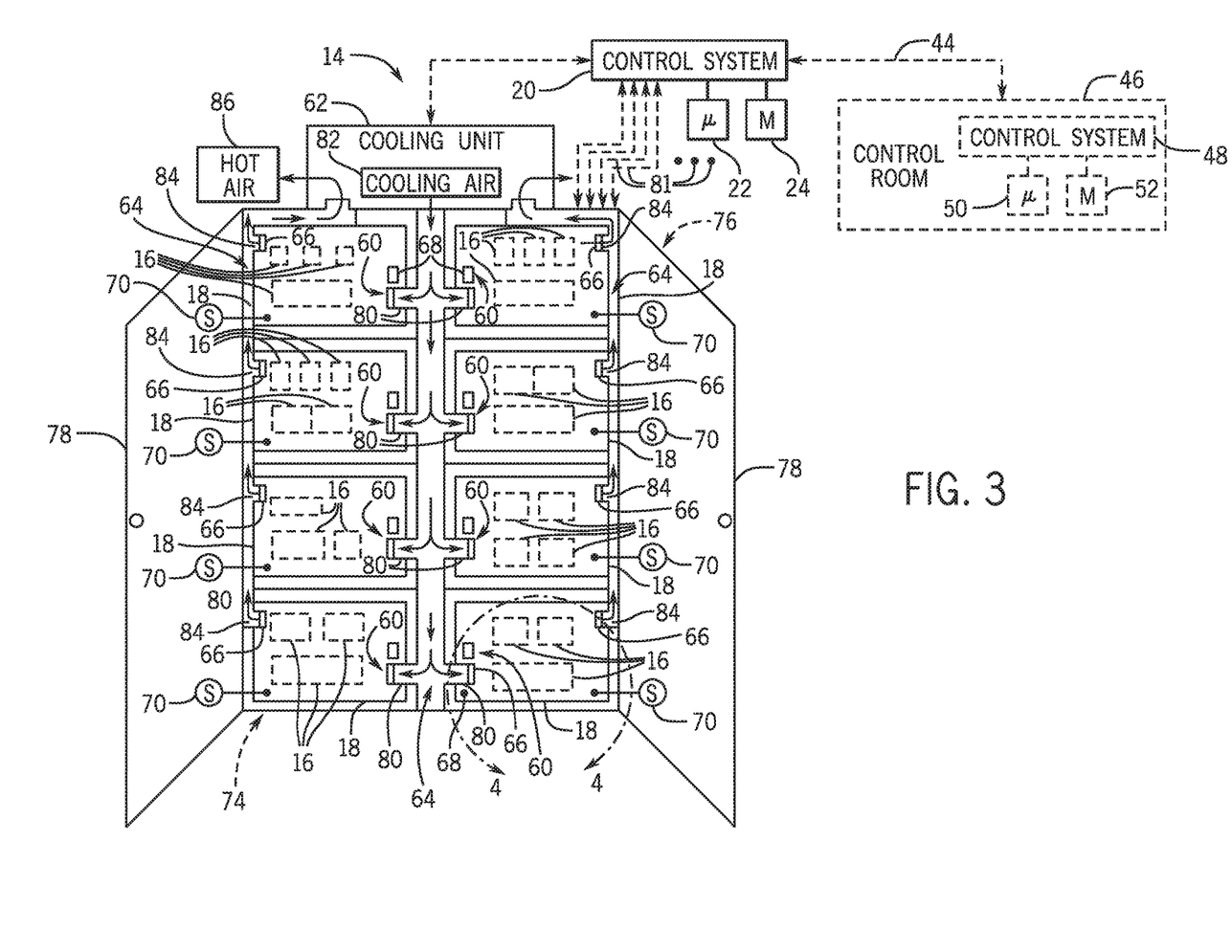
FIG. 3 is a schematic block diagram illustrating the cooling system of FIG. 2, where the cooling system includes an air distribution system associated with each compartment of the electrical enclosure of FIG. 1.

FIG. 3 is a schematic block diagram illustrating the cooling system 14 of FIG. 2, where the cooling system 14 includes an air distribution system 60 associated with each compartment 18 of the electrical enclosure of FIG. 1. In certain embodiments, the air distribution system 60 associated with each compartment 18 may include the series of air ducts 64, the vent system 66, the trigger system 68, and/or the one or more sensors 70. Further, the controller 20 of the cooling system 14 may be implemented on any suitable programmable architecture, such as an architecture including the one or more processors 22 and the one or more memory 24. In particular, once programmed, the controller 20 of the cooling system 14 may be considered to constitute a specially-configured device that is configured to control specific aspects relating to the thermal environment of the electrical enclosure 10 and/or each compartment 18 based at least on algorithmic structure associated with its programming. In this way, the controller 20 is configured to perform certain regulating functions, and these functions should be considered to denote a specific algorithmic structure of the cooling system 14 associated with the one or more processors 22 and the one or more memory 24.

By way of non-limiting example, the controller 20 of the cooling system 14 may include one or more application specific integrated circuits (ASICs), one or more field programmable gate arrays (FPGAs), one or more general purpose processors, or any combination thereof. Additionally, the memory 24 storing instructions executed by processors 22 of the cooling system 14 may include, but are not limited to, volatile memory, such as random access memory (RAM), and/or non-volatile memory, such as read-only memory (ROM), optical drives, hard disc drives, or solid-state drives. Further, the controller 20 may be implemented as a part of a larger control system (e.g., the control system 48 of the gas turbine system 12). It should be noted that in certain embodiments, one or more electrical enclosure 10 may be coupled together and/or to one or more networks, and the controller 20 may be utilized to control and/or regulate the cooling for each electrical enclosure 10 and/or each compartment 18 of each electrical enclosure 10.

In certain embodiments, each compartment 18 may be associated with one of the one or more air distribution systems 60. Accordingly, the controller 20 may have individual and separate control of the thermal environment for each of the one or more compartments 18 of the electrical enclosure 10. For example, each air distribution system 60 may include the series of ducts 64, such as air ducts 64. In certain embodiments, each compartment 18 may include a cooling duct 80 that provides cooling air 82 from the cooling unit 62 to the compartment 18. Further, each compartment 18 may include an exhaust duct 84 that removes hot air 86 from the compartment 18, and exhausts the hot air 86 into the external environment. In the illustrated embodiment, the exhaust duct 84 exhausts the hot air 86 via the cooling unit 62. In other embodiments, the exhaust duct 84 of each compartment 18 may exhaust directly into the external environment. In certain embodiments, the series of ducts 64, such as the air ducts 64, may be differently shaped and/or sized (e.g., different length, diameter, cross-section, radius, inner surface texture, etc.) based on the compartment 18 the air ducts 64 are associated with. For example, for a compartment 18 that includes one or more electrical components 16 that are needed to be kept at a lower temperature, the cross-section of the associated air ducts 64 may be larger.

In certain embodiments, each duct of the series of ducts 64 (e.g., the cooling duct 80 and/or the exhaust duct 84) may include the vent system 66 configured to open or close the vents associated with the ducts. For example, in certain embodiments, the cooling duct 80 may be configured to open to provide a flow of cooling air 82 to the compartment 18 when the vent system 66 is open. In certain embodiments, the vent system 66 may be configured to open and close based on control signals from the controller 20, thereby allowing the controller 20 to regulate the amount of cooling air 82 provided to each compartment 18 of the electrical enclosure 10. Furthermore, in certain embodiments, the vent system 66 may be configured to open and close based on the trigger system 68, allowing for automatic control of the vent system 66, as further described with respect to FIGS. 4-6.

In certain embodiments, the controller 20 of the cooling system 14 may be configured to receive feedback from each compartment 18, and may be configured to regulate the thermal environment of each compartment 18 based on the received feedback. For example, in certain embodiments, the one or more sensors 70 may be disposed within the interior of each compartment 18, and may be communicatively coupled to the controller 20 via a communication network 81. The sensors 70 may include temperature sensors, oxygen sensors, flow sensors, heat sensors, air sensors, and the like, and may be configured to provide an indication of the thermal environment of the compartment 18. In certain embodiments, the sensors 70 may be coupled and/or disposed on one or more of the electrical components 16.

Based on the feedback received from the sensors 70, the controller 20 may be configured to regulate the environment of the compartment 18. In certain embodiments, regulation of the thermal environment may be conducted based on a feedback loop, such that the temperature range of the compartment 18 is maintained within a predetermined range. Furthermore, in certain embodiments, the controller 20 may be configured to identify trends in the temperature, and may provide predictions and/or predictive adjustments for each of the one or more compartments 18 to maintain the thermal environment within a particular range. Additionally, in certain embodiments, the controller 20 may be configured to maintain a cooling of the compartments 18 based on a frequency with which a particular compartment 18, and/or particular electrical components 16, are accessed. Indeed, the one or more electrical components 16 may be categorized based on the frequency with which they are accessed, such as for maintenance and/or repair.

In certain embodiments, the controller 20 may be configured to open and/or close vents of the vent system 66 associated with the compartment 18, thereby providing the controller 20 with targeted control over one or more regions or compartments 18 of the electrical enclosure 10. For example, the vent system 66 may be communicatively coupled to the controller 20 via the communication network 81, such that the controller 20 is configured to provide control signals that control the position of the vents. In certain embodiments, the vents may be partially opened and/or partially closed, based on the flow of cooling air 82 desired and/or based on the amount of hot air 86 to be vented. Indeed, in certain embodiments, the controller 20 may regulate the flow of the cooling air 82 and/or the flow of the hot air 86 by regulating the vent system 66 and/or the cooling unit 62. In certain embodiments, the vent system 66 may be triggered by the trigger system 68 associated with each compartment 18 of the electrical enclosure 10, as further described with respect to FIGS. 4-6.

Figure 4:
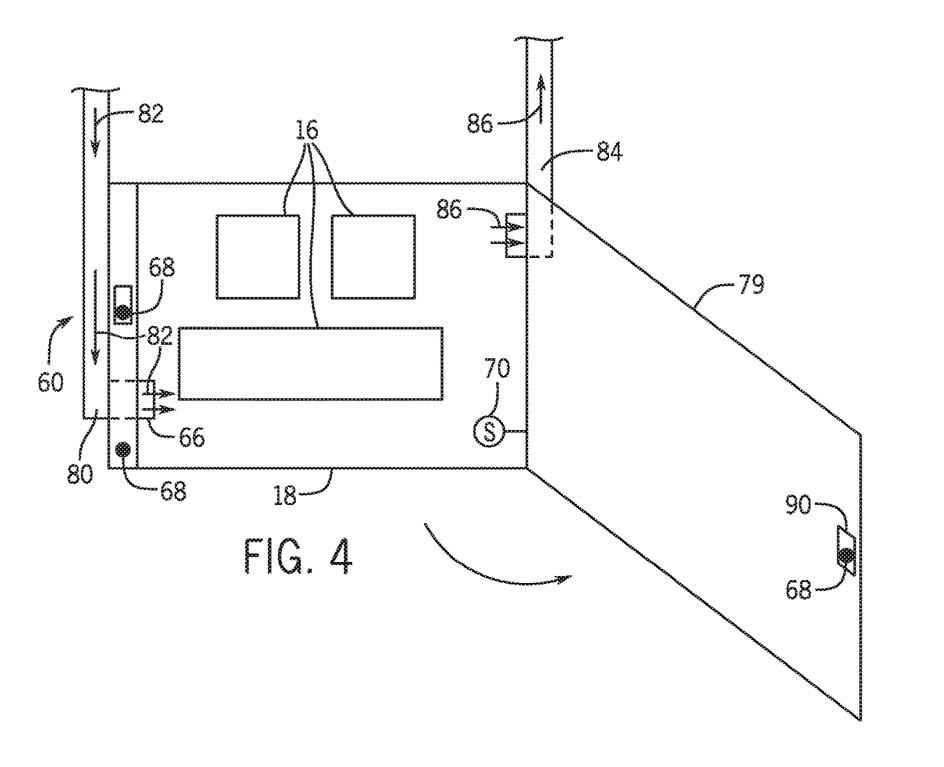
FIG. 4 is a schematic block diagram illustrating an embodiment of a vent system of the air distribution system of FIG. 3.

FIG. 4 is a schematic block diagram illustrating an embodiment of the vent system 66 of the air distribution system 60 of FIG. 3. As noted above, each compartment 18 may be configured to support one or more electrical components 16 that are communicatively coupled to one or more components of the gas turbine system 12. Further, each compartment 18 of the electrical enclosure 10 may be associated with the air distribution system 60, such that the controller 20 may be configured to individually regulate the thermal environment of each compartment 18. As noted above, in certain embodiments, each compartment 18 of the electrical enclosure 10 may include one or more interior doors 79 that cover the compartment 18. In certain situations, the interior door 79 may be opened to access the electrical components 16 disposed within for maintenance and/or repair. As noted above, it many beneficial to shut off the cooling air 82 typically provided to the compartment 18 when the interior door 79 is opened, so that cooing air 82 is not dissipated to the external environment. In certain embodiments, the trigger system 68 may be utilized to determine whether the interior door 79 of the electrical enclosure 10 is accessed, so that the cooling system 14 may regulate the thermal environment of compartment 18 in an efficient and controlled manner.

As noted above, in certain embodiments, the controller 20 may be configured to regulate a flow of cooling air 82 to the compartment 18 based thermal feedback from one or more sensors 70 disposed within the compartment 18. For example, the controller 20 may be communicatively coupled to the vent system 66 in order to open and/or close the vents based on the thermal feedback from the sensors 70. Accordingly, if the temperature of the compartment 18 is too high for optimal electrical components 16 function, the controller 20 may be configured to open the vents and provide a flow of cooling air 82 to the interior of the compartment 18. In certain embodiments, the vent system 66 may be automatically engaged by the trigger system 68. For example, in certain embodiments, the trigger system 68 may include a mechanical coupling with the vent system 66, and may be configured to close the vents of the vent system 66 when the interior door 79 is accessed. In this manner, when the compartment 18 is opened to access the one or more electrical components 16 disposed within, the cooling system 14 is configured to temporarily block the flow of the cooling air 82 directed to the accessed compartment 18. Accordingly, cooling air 82 typically utilized to cool the compartment 18 and maintain the thermal environment within a particular range is not wasted when the compartment 18 is exposed to the external environment.

In certain embodiments, the trigger system 68 may be disposed within a handle 90 of the compartment 18, such that when the handle 90 is engaged, the vents of the vent system 66 are automatically closed. For example, the trigger system 68 may include a first component disposed within the interior door 79 and a second component coupled to the compartment 18. In certain embodiments, the trigger system 68 may include a push button, an optical switch, a contact switch, or a combination thereof. Accordingly, when the first component is separated from the second component (e.g., the interior door 79 is accessed), the vent system 66 may be configured to automatically block the flow of cooling air 82 into the compartment 18. Likewise, when the interior door 79 of the compartment is closed, the vent system 66 may open the vents, and direct the flow of cooling air 82 back into the compartment 18.

Figure 5:
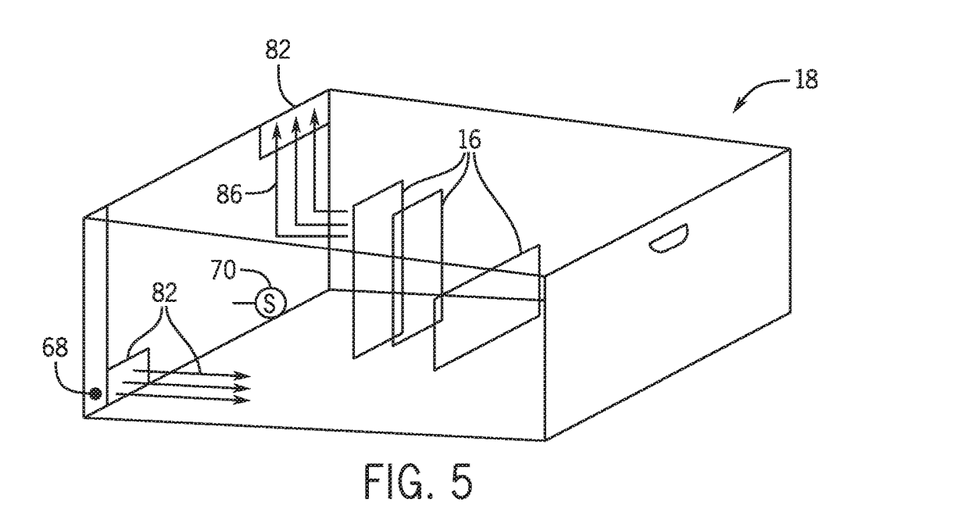
FIG. 5 is a schematic block diagram illustrating an embodiment of a trigger system of the air distribution system of FIG. 3.

FIG. 5 is a schematic block diagram illustrating an embodiment of the trigger system 68 of the air distribution system 60 of FIG. 3. As noted above, in certain embodiments, each compartment 18 of the electrical enclosure 10 may include one or more interior doors 79 that cover the compartment 18. For example, as illustrated in FIG. 4, the interior door 79 may be opened to access the electrical components 16 disposed within for maintenance and/or repair. In the illustrated embodiment, the electrical components 16 may be disposed within a drawer compartment 18, which may be accessed by pulling the compartment 18 from the electrical enclosure 10 on one or more rails or guides. In such embodiments, the trigger system 68 may be configured to mechanically engage the vent system 66 when the drawer compartment 18 is accessed. It should be noted that the disclosed techniques for the cooling system 14 may be implemented with one or more different types of compartments 18 within the electrical enclosure 10.

Figure 6:
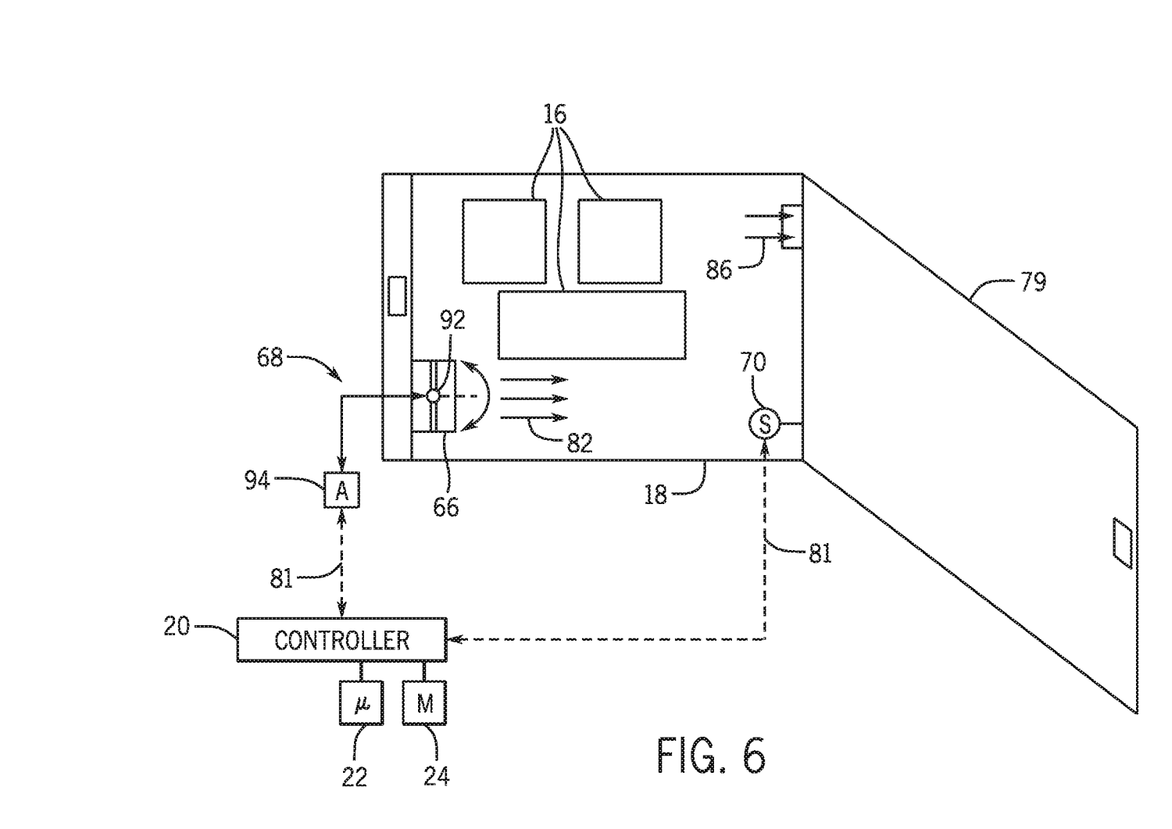
FIG. 6 is a schematic block diagram illustrating an embodiment of a trigger system of the air distribution system of FIG. 3.

FIG. 6 is a schematic block diagram illustrating an embodiment of the trigger system 60 of the air distribution system 60 of FIG. 3. As noted above, in certain embodiments, each compartment 18 of the electrical enclosure 10 may include one or more interior doors 79 that cover the compartment 18. In certain situations, the interior door 79 may be opened to access the electrical components 16 disposed within for maintenance and/or repair. As noted above, it many beneficial to shut off the cooling air 82 typically provided to the compartment 18 when the interior door 79 is opened, so that cooing air 82 does not dissipate to the external environment. In the illustrated embodiment, the trigger system 68 may include a switch 92 and an actuator 94 configured to engage when the interior door 79 is accessed. For example, the switch 92 may be triggered when the interior door 79 of the compartment is accessed. Further, the controller 20 may be configured to send one or more control signals to the actuator 94 to close the vents of the vent system 66, thereby blocking a flow of the cooing air 82 into the compartment 18. In this manner, the controller 20 may be configured individually and separately regulate the thermal environment of the compartment 18.

Technical effects of the disclosure include systems and methods for the cooling system 14 configured to cool electrical components 16 disposed within a compartmentalized electrical enclosure 10. The electrical components 16 disposed within the electrical enclosure 10 may be communicatively coupled to one or more components of a gas turbine system 12, and may be configured to monitor and/or control one or more operational functions of the gas turbine system 12. In certain embodiments, the cooling system 14 is configured to independently regulate a thermal environment for each of the one or more compartments 18 of the electrical enclosure 10. For example, the cooling system 10 may include a series of air distribution systems 60, such that each compartment 18 is associated with a particular air distribution system 60. The air distribution system 60 may include one or more ducts 64, one or more sensors 70, the trigger system 68, and the vent system 66. The controller 20 of the cooling system 14 may be configured to regulate the thermal environment of each compartment 18 via the air distribution system 60.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:
1. A system, comprising:
one or more electrical components associated with turbomachinery, wherein the one or more electrical components are disposed within two or more interior compartments of an electrical enclosure, and each interior compartment of the two or more interior compartments has an access cover; and a cooling system coupled to the electrical enclosure, wherein the cooling system comprises:
one or more air ducts configured to direct a cooling air to each interior compartment of the two or more interior compartments, wherein each compartment of the two or more interior compartments is coupled to a differently sized duct of the one or more air ducts to vary the flow of the cooling air to each of the two or more interior compartments; and
a controller configured to route cooling air to each interior compartment via the one or more air ducts, wherein the controller is configured to independently regulate a thermal environment for each interior compartment of the two or more interior compartments.

2. The system of claim 1, wherein the one or more electrical components are communicatively coupled to at least one turbomachinery component of a gas turbine system.

3. The system of claim 1, wherein each air duct of the one or more air ducts comprises a vent configured to regulate a flow of the cooling air into each interior compartment of the two or more interior compartments of the electrical enclosure.

4. The system of claim 3, wherein the controller is configured to close the vent to block the flow of the cooling air into each interior compartment of the two or more interior compartments of the electrical enclosure, and the controller is configured to open the vent to direct the flow of the cooling air into each interior compartment of the two or more interior compartments of the electrical enclosure.

5. The system of claim 1, wherein the cooling system comprises one or more sensors disposed within each interior compartment of the two or more interior compartments, wherein each sensor is communicatively coupled to the controller, and the controller is configured to independently regulate a thermal environment for each interior compartment of the two or more interior compartments based on sensor feedback from the one or more sensors.

6. The system of claim 1, wherein the controller is configured to independently regulate a thermal environment for each interior compartment of the two or more interior compartments based on a frequency of access in the interior compartment, trends in a temperature in the interior compartment, or predictions for the interior compartment, or a combination thereof.

7. The system of claim 1, wherein the cooling system comprises one or more exhaust ducts configured to output a hot air from each interior compartment.

8. The system of claim 1, wherein the cooling system comprises a trigger system associated with each interior compartment of the two or more interior compartments of the electrical enclosure, and the trigger system is configured to block a flow of the cooling air into each interior compartment of the two or more interior compartments of the electrical enclosure when the interior compartment is accessed by opening the respective access cover.

9. The system of claim 1, wherein each interior compartment of the two or more interior compartments comprises a drawer.

10. A system, comprising:
an electrical enclosure configured to house one or more electrical components within two or more interior compartments, wherein the one or more electrical components are associated with turbomachinery, each interior compartment of the two or more interior compartments has an access cover, the one or more electrical components comprise a plurality of electrical components arranged in two or more groups in the respective two or more interior compartments, and the two or more groups are based on suitable temperature levels for the plurality of electrical components; and
a cooling system coupled to the electrical enclosure, wherein the cooling system comprises:
one or more air ducts configured to direct a cooling air to each interior compartment of the two or more interior compartments; and
a vent system associated with each interior compartment of the two or more interior compartments, wherein the vent system is configured to block a flow of the cooling air into each interior compartment when the interior compartment is accessed by opening the respective access cover.

11. The system of claim 10, comprising a controller configured to route the flow of the cooling air to each interior compartment via the one or more air ducts.

12. The system of claim 11, wherein the controller is configured to independently regulate a thermal environment for each interior compartment of the two or more interior compartments based on a frequency of access in the interior compartment, trends in a temperature in the interior compartment, or predictions for the interior compartment, or a combination thereof.

13. The system of claim 10, wherein the controller is configured to independently regulate a thermal environment for each interior compartment of the two or more interior compartments based on the suitable temperature levels for the two or more groups.

14. The system of claim 11, wherein the one or more electrical components are communicatively coupled to at least one component of a gas turbine system.

15. A system, comprising:
an electrical enclosure configured to house a plurality of electrical components, wherein the plurality of electrical components are associated with at least one component of a gas turbine system, wherein the electrical enclosure comprises:
an interior;
an exterior access cover removably disposed over an opening into the interior;
two or more cooling compartments disposed in the interior, wherein each of the two or more cooling compartments are configured to house a portion of the plurality of electrical components, and each cooling compartment of the two or more cooling compartments has an access cover that is accessible after opening the exterior access cover; and
a cooling system configured to regulate one or more vents associated with each of the two or more cooling compartments, wherein the cooling system is configured to independently regulate a thermal environment for each of the two or more cooling compartments, and the cooling system is configured to at least reduce or stop regulating the thermal environment for at least one compartment of the two or more cooling compartments in response to a trigger that senses physically opening the access cover for the at least one compartment.

16. The system of claim 15, wherein the cooling system is configured to regulate the one or more vents to independently control a cooling flow for each cooling compartment of the two or more cooling compartments, disable the cooling flow for the at least one compartment during access in response to the trigger that senses physically opening the access cover, and enable the cooling flow for the at least one compartment after the access.

17. The system of claim 15, wherein the cooling system comprises one or more sensors disposed within each cooling compartment of the two or more cooling compartments, wherein each sensor of the one or more sensors is communicatively coupled to the controller, and the cooling system comprises a controller configured to independently regulate a thermal environment for each cooling compartment of the two or more cooling compartments based on feedback from the one or more sensors.

18. The system of claim 17, wherein the controller is configured to independently regulate a thermal environment for each cooling compartment of the two or more cooling compartments based on a frequency of access in the cooling compartment, trends in a temperature in the cooling compartment, or predictions for the cooling compartment, or a combination thereof.

19. The system of claim 15, comprising the gas turbine system.

* * * * *